United States Patent
Goering et al.

(10) Patent No.: US 6,337,873 B1
(45) Date of Patent: Jan. 8, 2002

(54) OPTICAL ARRANGEMENT FOR BALANCING THE BEAM OF ONE OR MORE HIGH POWER DIODE LASERS ARRANGED ONE ABOVE ANOTHER

(75) Inventors: Rolf Goering; Peter Schreiber, both of Jena (DE); Stefan Heinemann, Ann Arbor, MI (US); Ulrich Roellig, Jena; Michael Nickel, Ruttersdorf-Lotschen, both of (DE)

(73) Assignee: Jenoptik Aktiengesellschaft, Jena (DE)

( * ) Notice: Subject to any disclaimer, the term of this patent is extended or adjusted under 35 U.S.C. 154(b) by 0 days.

(21) Appl. No.: 09/380,927
(22) PCT Filed: Dec. 18, 1998
(86) PCT No.: PCT/EP98/08316
§ 371 Date: Nov. 30, 1999
§ 102(e) Date: Nov. 30, 1999
(87) PCT Pub. No.: WO99/35724
PCT Pub. Date: Jul. 15, 1999

(30) Foreign Application Priority Data

Jan. 9, 1998 (DE) ......................................... 198 00 590

(51) Int. Cl.$^7$ .................................................. H01S 3/09
(52) U.S. Cl. .......................... 372/69; 359/618; 359/642
(58) Field of Search .............................. 372/34, 36, 69, 372/75, 109, 101; 359/541, 623, 626, 627, 642, 652, 710, 618

(56) References Cited

U.S. PATENT DOCUMENTS

| | | | | |
|---|---|---|---|---|
| 5,784,203 A | * | 7/1998 | Beckmann | 359/618 |
| 5,808,803 A | * | 9/1998 | Ullmann et al. | 359/641 |
| 6,044,096 A | * | 3/2000 | Wolak et al. | 372/36 |
| 6,151,168 A | * | 11/2000 | Goering et al. | 359/623 |

FOREIGN PATENT DOCUMENTS

WO  WO 96/13884  9/1996

* cited by examiner

Primary Examiner—Hemang Sanghavi
Assistant Examiner—Omar Rojas, Jr.
(74) Attorney, Agent, or Firm—Reed Smith LLP

(57) ABSTRACT

An optical arrangement is provided for balancing the beam of one or more high-power diode lasers (HP-DL) arranged one above another.

The beam, which is known to diverge very differently in the direction of the pn junction and perpendicular to the pn junction of the emitters of an HP-DL arranged in a row is imaged at a point with high power density and high beam quality the arrangement. Present for this purpose are optical devices which spread out the radiation in a mutually offset fashion in the direction of the pn junction while the radiation is superimposed perpendicular to the pn junction.

8 Claims, 3 Drawing Sheets

OPTICAL ARRANGEMENT FOR BALANCING THE BEAM OF ONE OR MORE HIGH POWER DIODE LASERS ARRANGED ONE ABOVE ANOTHER

BACKGROUND OF THE INVENTION a) Field of the Invention

The invention relates to an arrangement for balancing the beam of one or more high-power diode lasers for the purpose of achieving high power densities in simultaneous conjunction with high beam quality in accordance with the preamble of patent claim 1.

b) Description of the Related Art

The emission characteristics of high-power diode lasers (diode lasers with a plurality of emitters or emitter groups arranged in a row) (termed HP-DL below) have been sufficiently frequently described. The special feature which arises with HP-DLs is the fact of the strongly differing divergence of the emitted beam and the spatial extent of the emitter arrangement in a plane parallel and perpendicular to the pn junction. Thus, in the plane of the pn junction (fast, axis below) the divergence is approximately 45 degrees FHWM (full width at half minimum), and in the plane perpendicular to the pn junction (slow axis below) it is approximately 10 degrees FHWM.

A radiation field of 1 $\mu$m height and 200 mm width is yielded, for example, given a row of 25 emitters which are at a distance of approximately 200 $\mu$m from one another, in the case of typical dimensions for an emitter of approximately 1 $\mu$m height×200 $\mu$m width. The emitted beam is inhomogeneous over the width of the radiation field, that is to say it comprises a plurality of beams determined by number, distance and width of the emitters. For the emitter arrangement quoted by way of example, the result is 25 beams with a beam exit aperture of 1 $\mu$m×200 $\mu$m. These beams can be combined in a complex or in groups, or else be shaped individually for the purpose of balancing the beam.

In the direction of beam propagation and starting from the HP-DLs, all known optical arrangements for balancing the beam of HP-DLs have in each case as first optical element a cylindrical lens, arranged upstream of a row of emitters, for collimating the beam in the direction of the fast axis. Different combinations of optical elements and assemblies are arranged below with the aim of realizing homogenization of the strongly differing beam qualities of the two planes.

Such arrangements are known from WO 96/13884, DE 196 45 150 and DE 195 00 513. The two first named solutions have the disadvantage that the number of the HP-DLs whose beam can be projected suitably into the arrangement is greatly limited, as a result of which the achievable total power of the HP-DL is limited to approximately 100 W.

The arrangement presented in DE 195 00 513 can be applied for HP-DLs having a large number of emitters, chiefly for a plurality of HP-DLs arranged one above another. This arrangement permits scaling to very high powers through the beam shaping of very many emitters. In the arrangement described in DE 195 00 513, the first step, as is known, is to collimate the beam of each individual HP-DL to a residual divergence of a few mrad in the direction of the fast axis by means of a cylindrical lens.

Because of the juxtaposition of a plurality of individual emitters or emitter groups, the beam in the direction of the slow axis is, as already mentioned, not a homogeneous line radiation source.

Since line radiation sources can be collimated or focused the better with the aid of an optical arrangement the smaller the extent of the line source, it is advantageous for the beams of the individual emitters or emitter groups to be collimated individually in the direction of the slow axis.

For this purpose, in DE 195 00 513 a prism system is arranged downstream of a cylindrical lens in each case in order to deflect the beam, collimated in the direction of the fast axis, of adjacent emitters or emitter groups in the direction of the fast axis. The partial beams thus deflected remain offset relative to one another in the direction of the slow axis. As a result, the cylindrical lens elements, assigned to the individual beams, of a segmented collimation lens system for collimating the beam in the direction of the slow axis can be arranged in an overlapping fashion with reference to the slow axis. Consequently, the refraction losses can be minimized by using larger collimation lenses even in the case of small distances between the emitters or emitter groups of an HP-DL. Good beam formation is rendered possible in the direction of the slow axis, but the segmented cylindrical lens system entails a substantial outlay on implementation.

The beam quality of the individual beams separated by the deflection described decisively determines the beam quality of the overall optical arrangement.

The optical system according to DE 195 00 513 does not, however, effect an optimum rearrangement of the beams from the point of view of beam quality:

The original offset of the separated individual beams along the slow axis is maintained, and there is no balancing of the beam quality by rearrangement in the two axial directions. Consequently, the beam quality, that is to say the achievable minimum focal range or the numerical aperture of the entire beam upon exiting from the arrangement is bounded below by the system.

However, there is a very high outlay on forming the beam in the direction of the slow axis owing to the insertion of a segmented collimation lens system.

OBJECT AND SUMMARY OF THE INVENTION

It is the primary object of the present invention to exhibit a new simpler optical arrangement which in addition to the efficient beam formation for the beam of one or more HP-DLs also carries out a beam rearrangement in such a way that balancing of the beam quality is achieved along the slow and fast axes before focusing, as a result of which the beam quality is substantially improved at the focus.

This object is achieved with the aid of an optical arrangement in accordance with the invention for balancing the beam of one or more high-power diode lasers, arranged one above another, for the purpose of focusing at a point. The arrangement includes a high power diode laser having a plurality of emitters or emitter groups arranged in a row and a first cylindrical lens arranged downstream of each row for collimating the beam of the emitters or emitter groups in a direction of the pn junction of the emitters (fast axis). Also included is a direction element with a number of different segments equal to the number of emitters or emitter groups, which deflect the beams in the direction of the fast axis by diffraction, refraction or reflection. Means are provided for collimating the beams in the direction perpendicular to the pn junction of the emitters (slow axis). A further lens focuses the entire beam at a point, the focus being situated on the optical axis, which is defined as the perpendicular to the direction of the slow axis and the fast axis. The means for collimating the beams in the direction perpendicular to the pn junction (slow axis) is a single second cylindrical lens. Segments of the direction element deflect the beams in the direction of the slow axis relative to one another in each case such that their principal rays overlap with the optical axis at a distance A from the direction element in the direction perpendicular to the pn junction and are arranged one above another at equal distances in the direction of the pn junction. A redirection element is arranged downstream at the distance A from each direction element which deflects the beams such that they run parallel to one another.

It is essential to the invention that the beams of the individual emitters or emitter groups of each individual HP-DL are deflected by optically diffracting, reflecting or refracting means such that they are superimposed in the direction of the slow axis so that they can be collimated in the direction of the slow axis with the aid of a single cylindrical lens, and substantial balancing of the overall beam is achieved.

The arrangement according to the invention is described below in more detail with the aid of the drawings.

DESCRIPTION OF THE PREFERRED EMBODIMENTS

Figure 1:
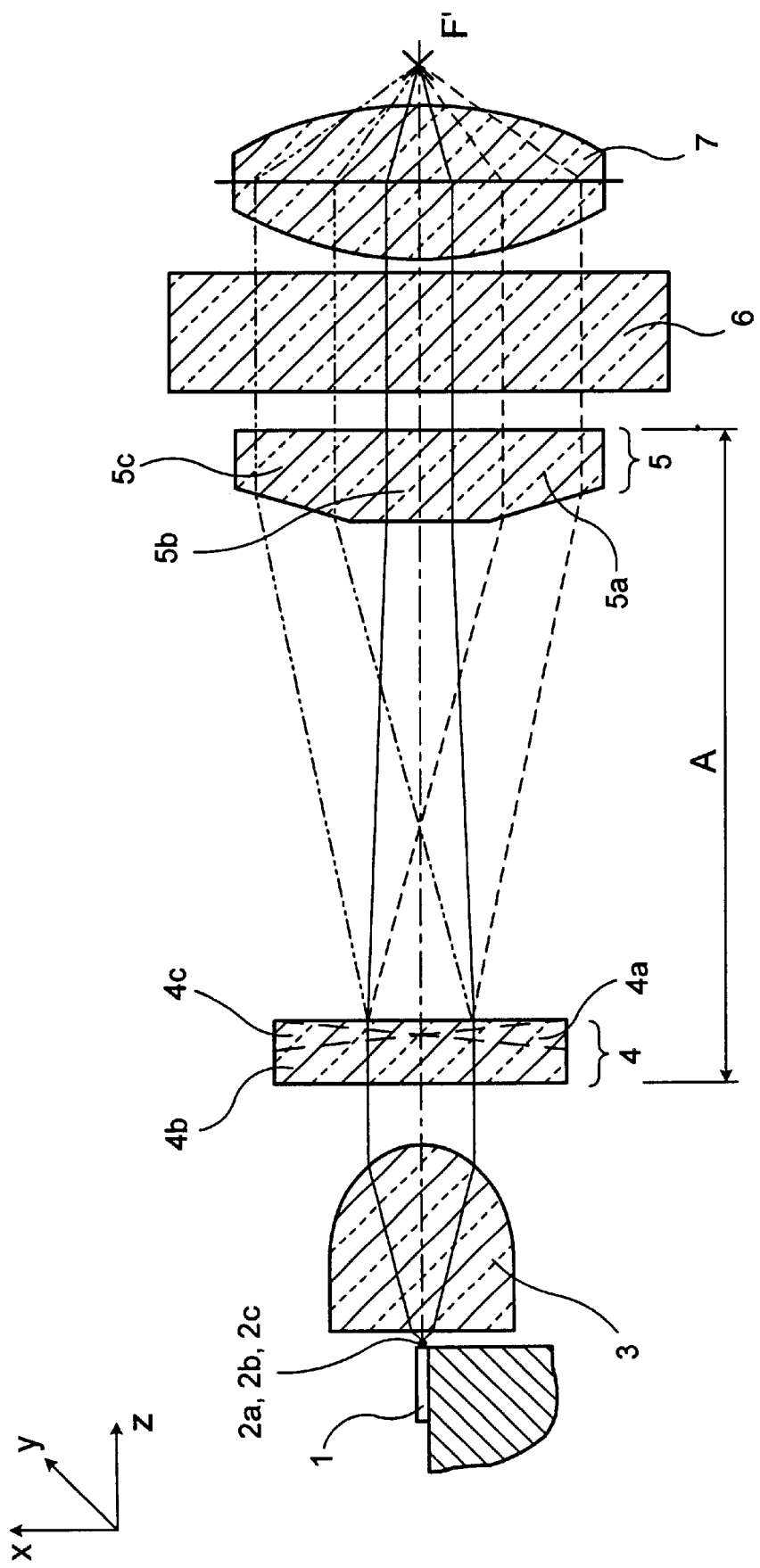
FIG. 1 shows the simplified representation of a first exemplary embodiments, suitable for an HP-DL with three emitters or emitter groups, in side view.

For the sake of clarity, as first exemplary embodiment an arrangement according to the invention is to be described which is suitable for focusing the beam of an HP-DL 1 with three emitters or emitter groups at a point. Consequently, the radiation field comprises three emitters or emitter groups 2a, 2b, 2c arranged next to one another on the slow axis.

As is to be seen from FIG. 1 and FIG. 2, the first exemplary embodiment comprises the following optical function elements, arranged in the following sequence in the beam direction of the HP-DL 1: A first cylindrical lens 3, a first deflecting element, denoted below as direction element 4, a second deflecting element, denoted below as redirection element 5, a second cylindrical lens 6 and a focusing lens 7. Except for the focusing lens 7, which can be a simple planar convex lens, all the optical function elements exert different influence on the beam of the emitters or the emitter groups 2a, 2b, 2c in the direction of the fast axis and of the slow axis. The different mode of operation of the arrangement on the beam is represented in FIG. 1 in the direction of the fast axis (x-z plane, side view), and in FIG. 2 in the direction of the slow axis (x-z plane, plan view) with the aid of the course of the beam.

The three beams, represented in FIG. 1, emitted by the emitters or emitter groups 2a, 2b and 2c are firstly collimated in the direction of the fast axis in a known way by means of a first cylindrical lens 3. According to the prior art, use is made for this purpose of aspherical cylindrical lenses which typically reduce the divergence to 5 mrad. Typical diameters of the beam after collimation are 0.6 mm on the fast axis. This first cylindrical lens 3 has no effects in the direction of the slow axis.

Figure 2:
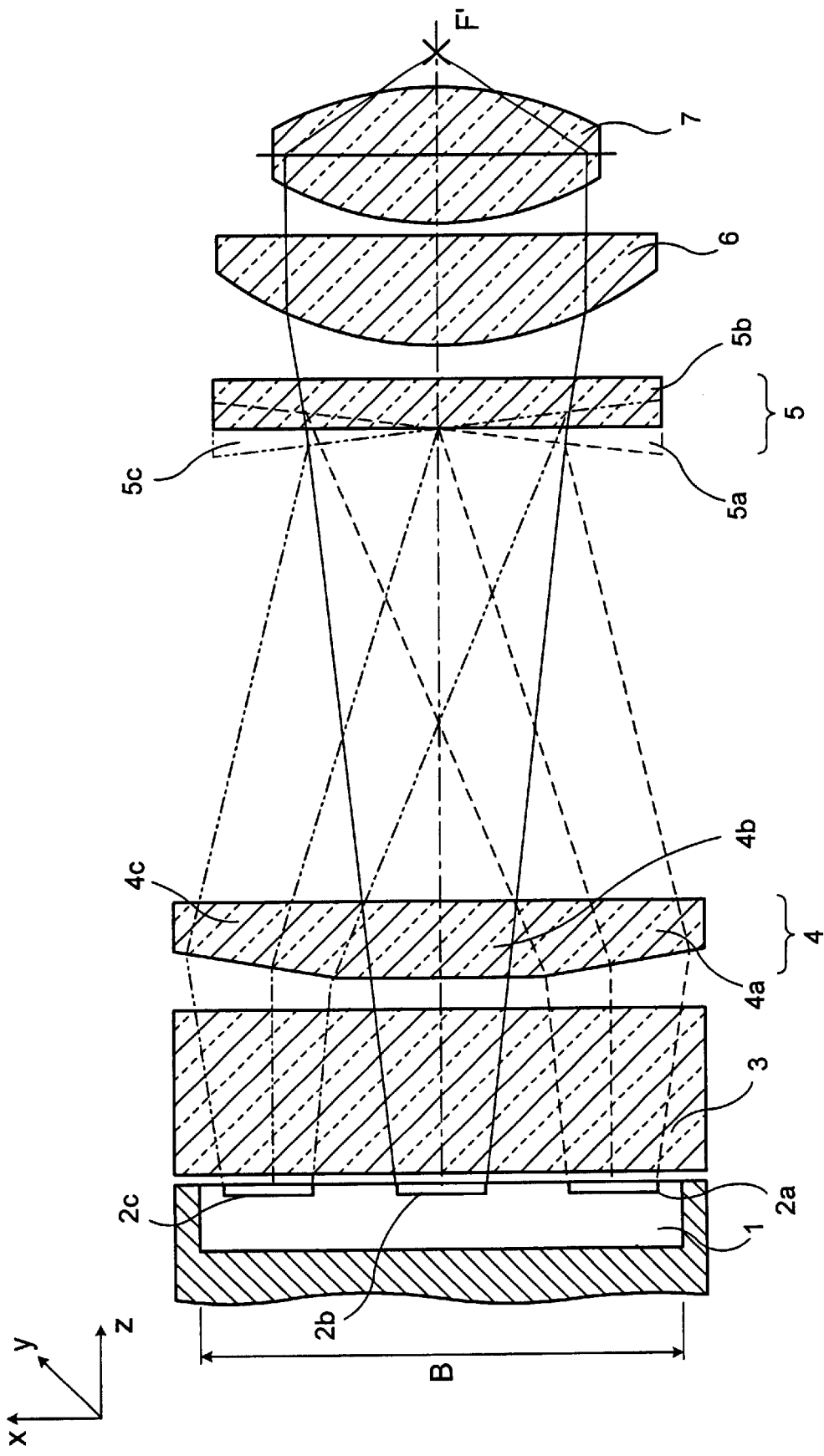
FIG. 2 shows the arrangement according to FIG. 1, in plan view.

The direction element 4 is arranged downstream of the first cylindrical lens 3 at a minimum possible distance, and is subdivided along the slow axis in accordance with the emitters or emitter groups 2a, 2b, 2c into three different segments 4a, 4b, 4c in such a way that upon passage the beams are deflected differently both in the direction of the fast axis and in that of the slow axis, as represented in FIG. 2. In this case, the beam of the middle emitter or emitter group 2b is not deflected in any direction. The deflection of the beam of the emitter or the emitter group 2a takes place toward the middle by a specific angle in the y-direction, and downward in the x-direction. The deflection of the beam of the emitter or the emitter group 2c takes place by the same absolute values, but in the respectively opposite direction. The absolute values of the deflection angles follow in principle from the geometric dimensions of the HP-DL, in particular the width B, which is yielded from the number, the spacing and the width of the individual emitters or emitter groups of an HP-DL, from the spacing P between the emitters and emitter groups of two HP-DLs, possibly arranged one above another, and from the axial spacing A between the direction element 4 and the redirection element 5. In the arrangement of the emitters or emitter groups 2a, 2b or 2c of an HP-DL selected in the exemplary embodiment, the deflection angles of the direction element 4 in the direction of the slow axis are selected in such a way that the principal rays of the individual beams intersect at a defined distance A from the direction element 4 in the plane of the redirection element 5. In the direction of the fast axis, the deflection angles of the direction element 4 are selected in such a way as to produce beams clearly separated from one another at the distance A. The redirection element 5 likewise comprises three segments which deflect the respectively passed beams so as exactly to compensate the deflection of the principal rays which is experienced in the x-direction and y-direction in the direction element 4. This is the precondition for optimum focusability. In order to focus all the beams in as small a spot as possible, a second cylindrical lens 6, acting in the direction of the slow axis, and a spherical focusing lens 7 are arranged downstream in the beam path. Owing to the direction element 4 and the redirection element 5, the beams of the individual emitters or emitter groups 2a, 2b, 2c are rearranged in such a way that they are subsequently no longer arranged next to one another in the y-direction, but in the x-direction. This leads to a best possible balancing of the strongly differing beam quality of the radiation from the HP-DL on both axes. This renders the subsequent beam shaping possible, even with a plainly better beam quality by comparison with the prior art, with the aid of a simple second cylindrical lens 6, without the use of a segmented collimation lens system. The focal length of the second cylindrical lens 6 is selected such that the beam passing through the redirection element 5 in the y-direction is collimated to a few mrad.

Figure 3:
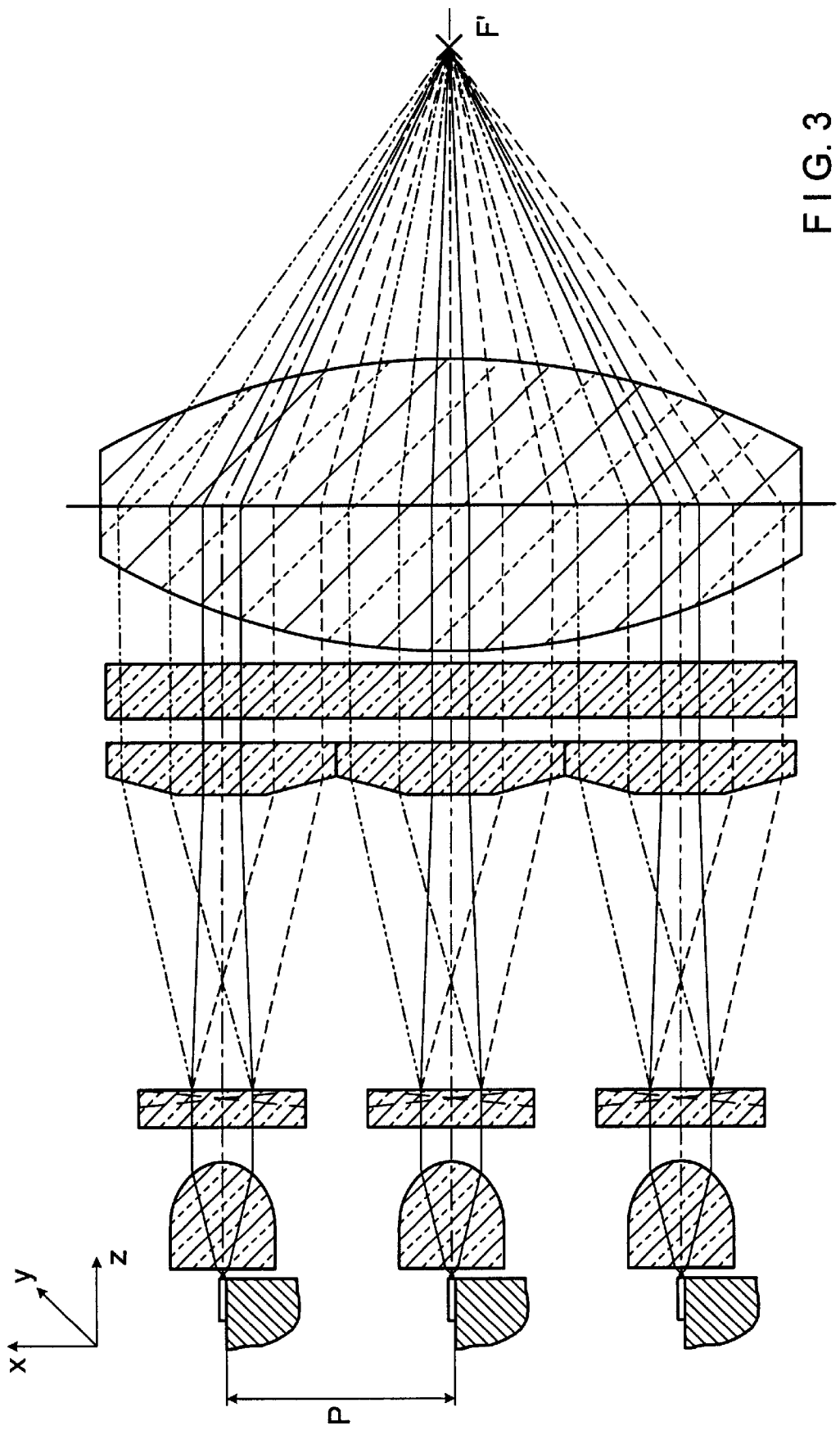
FIG. 3 shows the simplified representation of a second exemplary embodiment, suitable for three HP-DLs arranged one above another, in side view.

In a second exemplary embodiment, the arrangement according to the invention is to be designed for twenty-four HP-DLs arranged one above another. In FIG. 3, this second exemplary embodiment, reduced to the representation of the beams from three HP-DLs, is shown in side view. The emitters or emitter groups of two adjacent HP-DLs are at a distance of P from one another.

In principle, the design of the arrangement according to the invention and, correspondingly, the number of the HP-DLs are determined by the desired power and geometry at the point at which the beam is to be imaged. The power is decided by the number of the HP-DLs arranged one above another. The beam quality essentially depends on the number of the subdivisions of an emitter row into emitter groups, the maximum number of subdivisions possibly being equal to the number of the emitters. This is to be described below with the aid of the second exemplary embodiment.

The aim is to illuminate a rectangular beam spot with the edge lengths 2–4 mm² the numerical aperture being intended not to exceed 0.1 in the direction of the fast axis and the slow axis.

An edge length of 4 mm can be achieved by means of three emitter groups, arranged in a row, with a width of in each case 3.3 mm and a numerical aperture of 0.12. The optical function elements are now designed in the direction of the slow axis so as to produce a beam spot at the focus with a length of 4 mm and a numerical aperture of 0.1. Use is made for the beam shaping of a cylindrical lens and a biconvex focusing lens whose focal lengths are approximately 260 mm; the distance between the direction element and redirection element 4 and 5 is in the range of 60 mm.

An edge length of 2 mm height can be realized with a numerical aperture of 0.1. Based on the spacing of the emitter groups of two adjacent HP-DLs of typically 1.7 mm and a divergence of typically 5 mrad for the beam collimated in the direction of the fast axis, it is therefore possible to arrange 24 HP-DLs one above another in the direction of the fast axis in order to scale the power at the focus. A first cylindrical lens 3 is arranged downstream of each HP-DL, that is to say of each row of emitter groups. The extent of the subsequent direction element 4 in the x-direction is selected so as to rearrange the beam for all rows of emitter groups. For the case described of the threefold segmentation, the redirection element 5 comprises three segments each for one row each. In the case of the arrangement, selected in the exemplary embodiment, of the emitter groups 2, and given a stipulated distance P, the deflection angles of the direction element 4 in the direction of the slow axis (fast axis) are yielded as arctan(B/3A) (arctan[P/3A]). In the case of typical values for B and P of 10 mm and 1.7 mm, the result is a ratio of the deflection angles of approximately 6, and these angles are then about 3° and 0.50°, respectively, in the case of typical values of approximately 60 mm for A.

The function of the collimation in the direction of the slow axis can be fulfilled independently of the number of the emitter rows by an individual lens, though of different length. Likewise, focusing of all the beams is performed independently of the number of the emitter rows with the aid of only one focusing lens. For the purpose of matching the height of the beams in the direction of the fast axis at the location of the redirection element 5 to the height of the individual segments 5a, 5b, 5c, it is possible to select refocusing of the beams in the direction of the fast axis. This is achieved by displacing the cylindrical lens 3 in the z-direction. A relatively strong astigmatism caused by the refocusing can be compensated by arranging an array of cylindrical lenses directly upstream or downstream of the direction element 5.

In the present case, a refocusing to approximately 0.55 mm of the beams in the redirection plane S would be necessary for the three-fold division and a distance P of typically 1.7 mm. Given the use of available aspherical lenses, such refocusing could be achieved even given lens thicknesses of 1.5 mm.

In the two exemplary embodiments, the direction elements 4 and redirection elements 5 are represented for the sake of simplicity as transmissive prism systems. It is clear to the person skilled in the art that these elements can likewise also be of a different structure as reflective systems, for example Fresnel structures and diffractive structures. All direction and redirection elements 4, 5 can be designed in each case individually or jointly as a monolith or quasi-monolith. Of course, the individual segments, deflecting the beams in different ways, of the direction and redirection elements 4, 5 can also be independent optical elements. The outlay on producing and assembling the optical system is substantially reduced by comparison with the prior art if the direction element 4 is designed as a monolith, or the functions of the direction element 4 and the redirection element 5 are combined in one optical element, and the latter is designed as a monolith.

While the foregoing description and drawings represent the present invention, it will be obvious to those skilled in the art that various changes may be made therein without departing from the true spirit and scope of the present invention.

What is claimed is:

1. An optical arrangement for balancing the beam of one or more high-power diode lasers, arranged one above another, for the purpose of focusing at a point, comprising:
   a high-power diode laser having a plurality of emitters or emitter groups arranged in a row;
   a first cylindrical lens arranged downstream of each row for collimating the beam of the emitters or emitter groups in a direction of a fast axis of the pn junction of the emitters;
   a direction element with a number of different segments equal to the number of emitters or emitter groups, which deflect the beams in the direction of the fast axis by diffraction, refraction or reflection;
   means for collimating the beams in the direction of the slow axis perpendicular to the pn junction of the emitters;
   a lens focusing the entire beam at a point, the focus being situated on the optical axis, which is defined as the perpendicular to the direction of the slow axis and the fast axis;
   said means for collimating the beams in the direction perpendicular of the slow axis to the pn junction being a single second cylindrical lens;
   segments of the direction element deflecting the beams in the direction of the slow axis relative to one another in each case such that their principal rays overlap with the optical axis at a distance A from the direction element in the direction perpendicular to the pn junction and being arranged one above another at equal distances in the direction of the pn junction; and
   a redirection element being arranged downstream at the distance A from each direction element which deflects the beams such that they run parallel to one another.

2. The optical arrangement as claimed in claim 1, wherein for the purpose of matching the distance of the high-power diode lasers along the fast axis the first cylindrical lenses perform intermediate focusing into a redirection plane.

3. The optical arrangement as claimed in claim 2, wherein arranged directly upstream or downstream of the redirection element is a cylindrical lens array which compensates the relatively strong astigmatism caused by the intermediate focusing.

4. The optical arrangement as claimed in claim 1, wherein the optical arrangement reduces the radiation of the high-power diode laser in the plane of the slow axis at least by a factor of two, preferably of three, with the result that at least two, preferably at least three beams offset in parallel on the fast axis emerge in the plane of the fast axis downstream of the direction element.

5. The optical arrangement as claimed in claim 1, wherein given the arrangement of a plurality of HP-DLs the number of segments of the direction elements and redirection elements is matched to a distance P of the HP-DLs relative to one another in such a way that the beam qualities are balanced to the highest possible degree in both planes in a fashion limited by the residual divergence of the beams on the fast axis.

6. The optical arrangement as claimed in claim 1, wherein the direction element, arranged downstream of an HP-DL in each case, and the redirection element are designed as a monolith.

7. The optical arrangement as claimed in claim 1, wherein all direction elements are designed as a monolith.

8. The optical arrangement as claimed in claim 1, wherein all redirection elements are designed as a monolith.

* * * * *